(12) United States Patent
Nakaya

(10) Patent No.: US 6,362,647 B1
(45) Date of Patent: Mar. 26, 2002

(54) PROGRAMMABLE FUNCTION DEVICE AND MEMORY CELL THEREFOR

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/413,693

(22) Filed: Oct. 7, 1999

(30) Foreign Application Priority Data

Oct. 9, 1998 (JP) ............................................. 10-288064

(51) Int. Cl.[7] ............................................. H03K 19/177
(52) U.S. Cl. ............................. 326/40; 326/38; 326/39; 326/41; 327/202
(58) Field of Search ............................. 326/38, 39, 40, 326/41; 327/202

(56) References Cited

U.S. PATENT DOCUMENTS

| 4,821,233 | A | | 4/1989 | Hsieh | |
|---|---|---|---|---|---|
| 5,260,611 | A | * | 11/1993 | Cliff et al. | 326/39 |
| 5,430,687 | A | * | 7/1995 | Hung et al. | 365/230.08 |
| 5,770,951 | A | * | 6/1998 | Cheung et al. | 326/38 |
| 6,002,284 | A | * | 12/1999 | Hill et al. | 327/202 |
| 6,046,603 | A | * | 4/2000 | New | 326/38 |
| 6,080,205 | A | * | 6/2000 | Oshikawa | 716/8 |

OTHER PUBLICATIONS

Partially Translated Office Action of an examiner at JPO JPN, Application HEI 9–270193.

* cited by examiner

Primary Examiner—Michael Tokar
Assistant Examiner—Steven S. Paik
(74) Attorney, Agent, or Firm—Hutchins, Wheeler & Dittmar

(57) ABSTRACT

A circuit for writing data to configuration memories is utilized to write initial value data to the configuration memories, thereby initializing the same. In addition, a transistor for providing disconnection between a writing data signal and an output signal of a configuration memory is inserted so that no collision occurs between both signals during the writing of data to the configuration memory.

26 Claims, 10 Drawing Sheets

PROGRAMMABLE FUNCTION DEVICE AND MEMORY CELL THEREFOR

BACKGROUND OF THE INVENTION

The present invention relates to a programmable function device capable of setting the function of a circuit or the connection between circuits in various manners according to configuration data as well as to a memory cell for such a programmable function device, and more particularly to a circuit which sets configuration data in the programmable function device.

Programmable function devices such as PLDs (Programmable Logic Devices) and FPGAs (Field Programmable Gate Arrays) have been heretofore known. This kind of programmable function device is capable of setting the function of an integrated circuit in various manners according to configuration data to be loaded, and finds a wide variety of demands as a substitution for ASICs (Application Specific Integrated Circuits) having fixed functions. This kind of programmable function device is also expected as a re-configurable processor capable of providing an optimum hardware architecture according to a given problem.

A configuration circuit is a device for loading the configuration data into such a programmable function device and realizing a specific function (this procedure will be hereinafter referred to as configuration of a programmable function device).

The configuration circuit includes a plurality of configuration memories, and is disclosed in, for example, U.S. Pat. Nos. 5,430,687, 5,770,951 and 4,821,233.

As will be described later in detail, the above-described configuration circuit has the following problems.

The first problem is that the configuration memories are difficult to initialize. This is because the configuration circuit does not have the function of initializing the configuration memories.

The second problem is that a large amount of current is consumed during writing of data to the configuration memories and the speed of the writing is slow. This is because collisions occur between data signals and output signals of the configuration memories during the writing of data to the configuration memories.

SUMMARY OF THE INVENTION

An object of the present invention is, therefore, to provide a programmable function device which includes a configuration circuit having a simple initializing circuit for configuration memories.

Another object of the present invention is to provide the programmable function device including configuration memories to which data can be rapidly and reliably written with a small amount of current consumed during data writing.

The present invention is applied to a programmable function device in which one logic function is selected from among a plurality of logic functions according to data stored in a memory cell array comprised of a plurality of memory cells arranged in the form of an array. The programmable function device comprises a configuration circuit for writing data to the memory cell array.

According to a first aspect of the present invention, the configuration circuit includes at least one data shift register having a data input terminal, a plurality of data output terminals, and a clock input terminal. The data shift register is operative to serially read data through the data input terminal in synchronism with a clock signal inputted to the clock input terminal and to shift data held internally of the data shift register. The configuration circuit includes a plurality of data initializing circuits each having a first initializing input terminal, a second initializing input terminal, and an initializing output terminal. Each of the first initializing input terminals is connected to each of the plurality of data output terminals. A data initializing signal is applied to the second initializing input terminals. Each of the initializing output terminals is connected to the data input terminals of the memory cells arranged along one of columns of the memory cell array. The configuration circuit further includes an addressing circuit for selecting at least one row of the memory cell array and writing output signals of the data initializing circuits into the memory cells arranged along the selected at least one row. Each of the data initializing circuits is operative to output an initial value to be written into the memory cell array when the data initializing signal is made active, and to output a signal corresponding to a signal applied to the first initializing input terminal when the data initializing signal is made inactive.

According to a second aspect of the present invention, the configuration circuit includes at least one data shift register having a data input terminal, a plurality of data output terminals, a clock input terminal, and a clock enable terminal. The data shift register is operative to, when an input to the clock enable terminal is at its active level, serially read data through the data input terminal in synchronism with a clock signal inputted to the clock input terminal and to shift data held internally of the data shift register. The configuration circuit also includes a plurality of data initializing circuits each having a first initializing input terminal, a second initializing input terminal, and an initializing output terminal. Each of the first initializing input terminals is connected to each of the plurality of data output terminals. A data initializing signal is applied to the second initializing input terminals. Each of the initializing output terminals is connected to the data input terminals of the memory cells arranged along one of columns of the memory cell array. The configuration circuit further includes an addressing circuit for selecting at least one row of the memory cell array and writing output signals of the data initializing circuits to the memory cells arranged along the selected at least one row. Each of the data initializing circuits is operative to output an initial value to be written into the memory cell array when the data initializing signal is made active, and to output a signal corresponding to a signal applied to the first initializing input terminal when the data initializing signal is made inactive.

DESCRIPTION OF THE PREFERRED EMBODIMENTS

Figure 1:
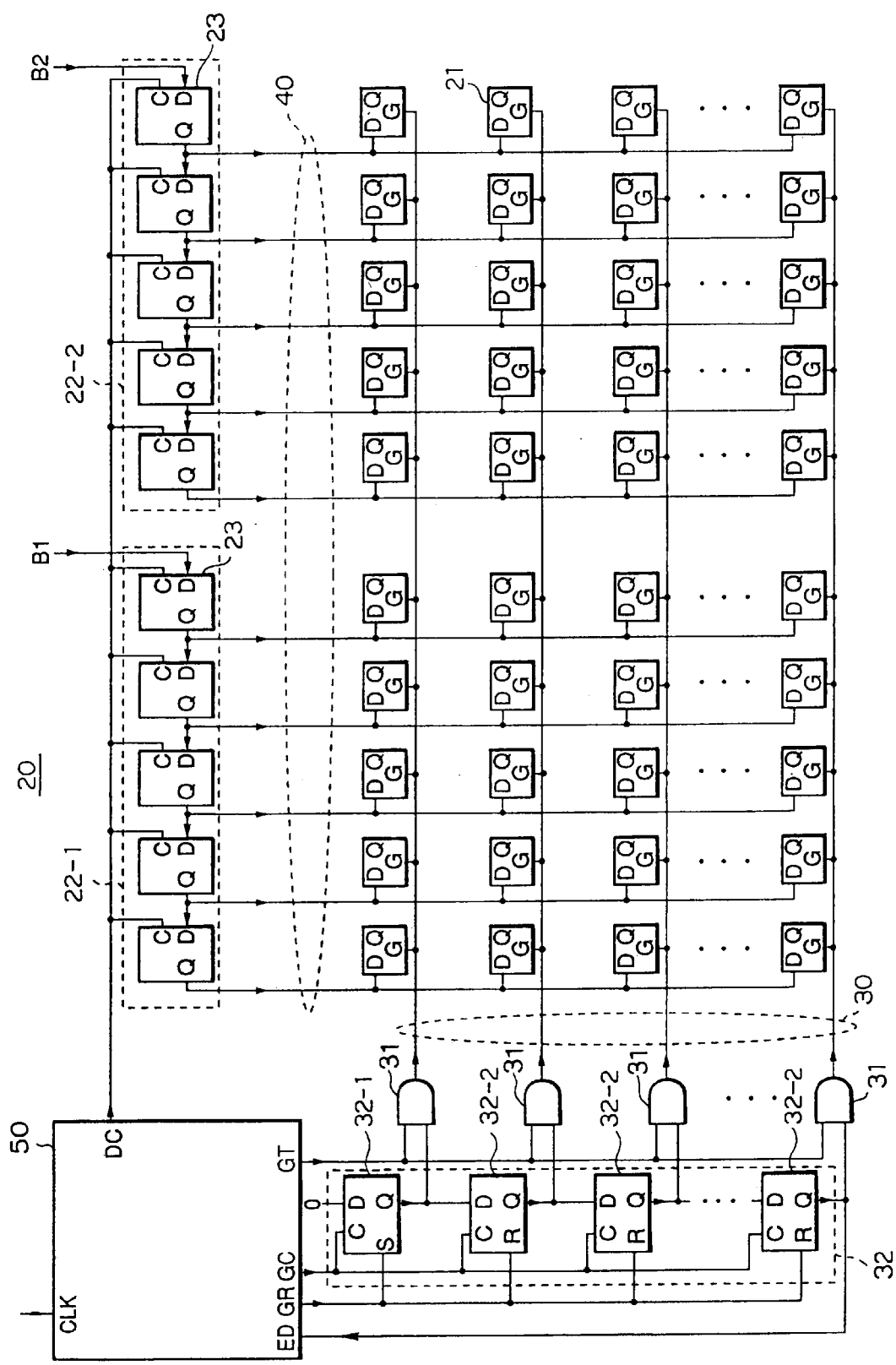
FIG. 1 is a circuit diagram showing the construction of a conventional configuration circuit.

For ease of understanding of the present invention, a conventional configuration circuit will be described below with reference to FIG. 1. As shown in FIG. 1, a configuration circuit 20 includes a plurality of configuration memories 21 which are arranged in a two-dimensional array with M rows and N columns. M and N represent a positive integer greater than unity. The configuration circuit 20 also includes M gate lines 30 each of which is connected in common to gate input terminals G of the respective configuration memories 21 arranged along the corresponding one of the rows of the two-dimensional array, and N data lines 40 each of which is connected in common to data input terminals D of the respective configuration memories 21 arranged along the corresponding one of the columns of the two-dimensional array. Outputs of M two-input AND circuits 31 are connected to the M gate lines 30, respectively. A gate shift register 32 has M data output terminals. The M data output terminals are respectively connected to a first input terminals of the M two-input AND circuits 31. The configuration circuit 20 also has K data shift registers 22-1, 22-2, . . . , 22-K(not shown). Each of the K data shift registers 22-1, 22-2, . . . , 22-K receives the corresponding one of bits B1, B2, . . . , BK(not shown) of configuration data to be inputted in units of a K-bit word, and has s data output terminals which are respectively connected to a plurality of corresponding ones of N data lines 40. s represents a positive integer greater than unity. The configuration circuit 20 further has a configuration control circuit 50 which controls the above-described circuitry. FIG. 1 shows one example of N =10, K=2 and s=5, and the following description will be given in connection with this example.

The configuration control circuit 50 has an output terminal DC through which a clock signal is supplied to the data shift registers 22-1 and 22-2, and an output terminal GC through which a clock signal is supplied to the gate shift register 32. The configuration control circuit 50 also has an output terminal GR through which a set/reset signal is delivered, and a gating terminal GT which is connected to second input terminals of the respective M two-input AND circuits 31 in order to control the timing of writing of the data into the configuration memories 21. The configuration control circuit 50 further has various input/output terminals necessary for control, such as a terminal ED through which an end-of-configuration signal is received, and an input terminal CLK through which a clock signal is received.

Each of the data shift registers 22-1 and 22-2 is made of s, i.e., five, D-type flip-flops 23 each having a clock input terminal C, a data input terminal D, and a data output terminal Q. Each of the data shift registers 22-1 and 22-2 is a serial input-parallel output type of shift register. In the data shift register 22-1, the data input terminal D of a first D-type flip-flop 23 constitutes the data input terminal of the shift register 22-1 and the data output terminal Q of an i-th D-type flip-flop 23 (i=1, 2, . . . , s−1) is connected to the data input terminal D of an (i+1)-th D-type flip-flop 23. Accordingly, all data outputs of the five D-type flip-flops 23 constitute the data output of the shift register 22-1. The data shift register 22-2 also has a similar construction.

The gate shift register 32 includes a single D-type flip-flop 32-1 which has a clock input terminal C, a data input terminal D fixed to a low level, a set input terminal S, and a data output terminal Q. The gate shift register 32 also has (M−1) D-type flip-flops 32-2 each of which has a clock input terminal C, a data input terminal D, a reset input terminal R, and a data output terminal Q. In the gate shift register 32, the data output terminal Q of the D-type flip-flop 32-1 is connected to the data input terminal D of a first D-type flip-flop 32-2, and the data output terminal Q of an i-th D-type flip-flop 32-2 (i=1, 2, . . . , M−1) is connected to the data input terminal D of an (i+1)-th D-type flip-flop 32-2. Accordingly, all data outputs of the D-type flip-flop 32-1 and the (M−1) D-type flip-flops 32-2 constitute the data output of the gate shift register 32. An M-th data output of the gate shift register 32 (i.e., the data output of an (M−1)-th D-type flip-flop 32-2 is connected to the terminal ED of the configuration control circuit 50 as the end-of-configuration signal.

This configuration circuit 20 does not have a circuit for initializing the configuration memories 21. One feasible method for solving this problem is to employ a special configuration memory which is automatically initialized at power on. This method is disclosed in, for example, U.S. Pat. No. 4,821,233. However, since transistors having different threshold voltages are required to fabricate such a configuration memory, there is the problem that the configuration memory is difficult to manufacture. Another method for memory initialization is to employ a memory cell having a built-in reset circuit. In this case, since the size of the memory cell is large and a global wiring for memory resetting is required, there is the problem of deterioration in the degree of circuit integration.

Figure 2:
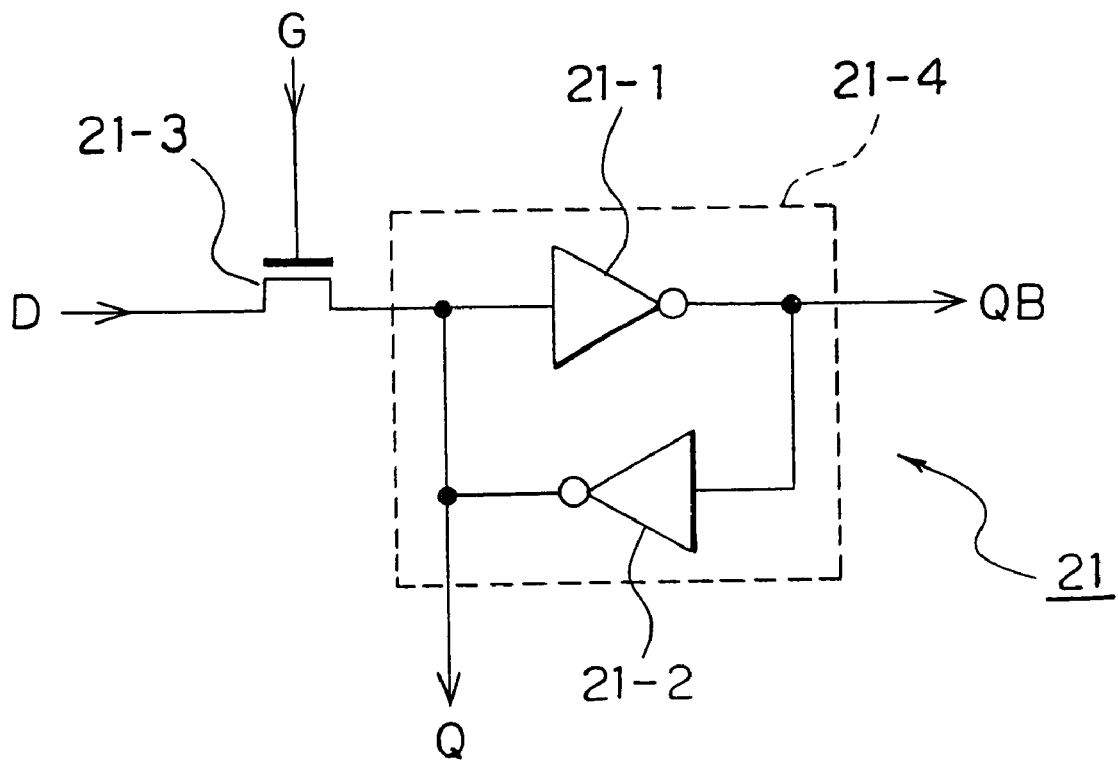
FIG. 2 is a circuit diagram showing the construction of a conventional configuration memory.

FIG. 2 shows a conventional example of such a configuration memory 21. This is disclosed in, for example, U.S. Pat. No. 4,821,233. The shown configuration memory 21 is made of first and second inverters 21-1 and 21-2 and an NMOS transistor 21-3 which constitutes a data input switch. An output of the first inverter 21-1 is connected to an input of the second inverter 21-2 and also to an inverted output terminal QB of the configuration memory 21. Incidentally, in FIG. 1, there are not shown the inverted output terminals QB of the respective configuration memories 21 for the sake of simplicity. An output of the second inverter 21-2 is connected to an input of the first inverter 21-1 and also to the output terminal Q of the configuration memory 21. These first and second inverters 21-1 and 21-2 which are interconnected to each other constitute a data holding circuit 21-4.

Either one of a source terminal and a drain terminal of the NMOS transistor 21-3 is connected to the input of the first inverter 21-1, while the other of the source terminal and the drain terminal is connected to the data input terminal D of the configuration memory 21. A gate terminal of the NHOS transistor 21-3 is connected to the gate input terminal G of the configuration memory 21. In the configuration memory 21, when the gate input terminal G is at a high level (a logical "1" level), the signal at the data input terminal D is written into the data holding circuit 21-4. When the gate input terminal G is reset to a low level (a logical "0" level), the data input terminal D and the data holding circuit 21-4 are disconnected from each other, and the data written at this time continues to be held in the data holding circuit 21-4. This operation is called "data latch".

In the conventional configuration memory 21, there is a possibility that a data signal and the output signal of the second inverter 21-2 may collide with each other during data writing. Accordingly, the conventional configuration memory 21 has the problem that its power consumption becomes large and its data writing speed becomes slow.

A configuration circuit according to a first embodiment of the present invention will be described below with reference to FIG. 3. A configuration circuit 60A according to the first embodiment includes a plurality of configuration memories 61A which are arranged in a two-dimensional array, two data shift registers 62-1A and 62-2A, a plurality of data initializing circuits 63A, a gate shift register 70A, a plurality of gate control circuits 80A, and a configuration control circuit 90A.

The data shift register 62-1A is made of s D-type flip-flops 64A. In the data shift register 62-1A, a data input terminal D of a first D-type flip-flop 64A constitutes a data input terminal of the data shift register 62-1A and a data output terminal Q of an i-th D-type flip-flop 64A (i=1, 2, ..., s−1) is connected to the data input terminal D of an (i+1)-th D-type flip-flop 64A. Accordingly, the data output terminals Q of all the D-type flip-flops 64A constitute data output terminals DFF1 to DFFs of the data shift register 62-1A. The data shift register 62-2A also has a similar construction. Incidentally, FIG. 3 shows an example of s=5, and the following description will be given in connection with this example.

Each of the D-type flip-flops 64A further has a clock input terminal C to which a clock signal CLK is supplied, and a clock enable terminal E which is connected to a data clock enable terminal DE of the configuration control circuit 90A. The data output terminals DFF1 to DFF5 of each of the data shift registers 62-1A and 62-2A are connected respectively to input terminals (first initializing input terminals) D of the corresponding data initializing circuits 63A. Input terminals (second initializing input terminals) I of all the data initializing circuits 63A are connected to a data initializing terminal DI of the configuration control circuit 90A. A plurality of output ,terminals (initializing output terminals) O of each of the data initializing circuits 63A are connected respectively to the data input terminals D of the corresponding ones of the configuration memories 61A through the corresponding one of a plurality of data lines 65.

The gate shift register 70A includes a single D-type flip-flop 71-1A and (M−1) D-type flip-flops 71-2A. A data input terminal D of the D-type flip-flop 71-1A is fixed to the low level, and a data output terminal Q of the D-type flip-flop 71-1A is connected to a data input terminal of a first D-type flip-flop 71-2A. A data output terminal Q of an i-th D-type flip-flop 71-2A (i=1, 2, ..., M−1) is connected to a data input terminal of an (i+1)-th D-type flip-flop 71-2A. Accordingly, the respective data output terminals Q of the D-type flip-flops 71-1A and 71-2A are connected to output terminals (address output terminals) GFF1 to GFFM of the gate shift register 70A.

Each of the D-type flip-flops 71-1A and 71-2A further has a clock input terminal C to which the clock signal CLK is supplied, and a clock enable terminal E which is connected to a gate clock enable terminal GE of the configuration control circuit 90A. The D-type flip-flop 71-1A further has an initializing terminal N which is connected to a gate register initializing terminal GR of the configuration control circuit 90A. Each of the D-type flip-flops 71-2A further has an initializing terminal R which is connected to the gate register initializing terminal GR of the configuration control circuit 90A.

If the gate register initializing terminal GR is asserted, the D-type flip-flop 71-1A of the gate shift register 70A is initialized to the high level, while the D-type flip-flops 71-2A are initialized to the low levels. The respective data output terminals GFF1 to GFFM of the gate shift register 70A are connected to input terminals (first input terminal) D of the corresponding gate control circuits 80A. Input terminals (second input terminal) I of all the gate control circuits 80A are connected to a gate initializing terminal GI of the configuration control circuit 90A. Input terminals T (third input terminal) of all the gate control circuits 80A are connected to a gating terminal GT of the configuration control circuit 90A. An M-th output terminal GFFM of the gate shift register 70A is connected to a terminal ED of the configuration control circuit 90A for sending an end-of-configuration signal. The configuration control circuit 90A has an output terminal END through which to inform the outside of the end of configuration. Output terminals O of the respective gate control circuits 80A are connected to gate input terminals G of the configuration memories 61A arranged along the corresponding rows, through a plurality of gate lines 85.

Figure 3:
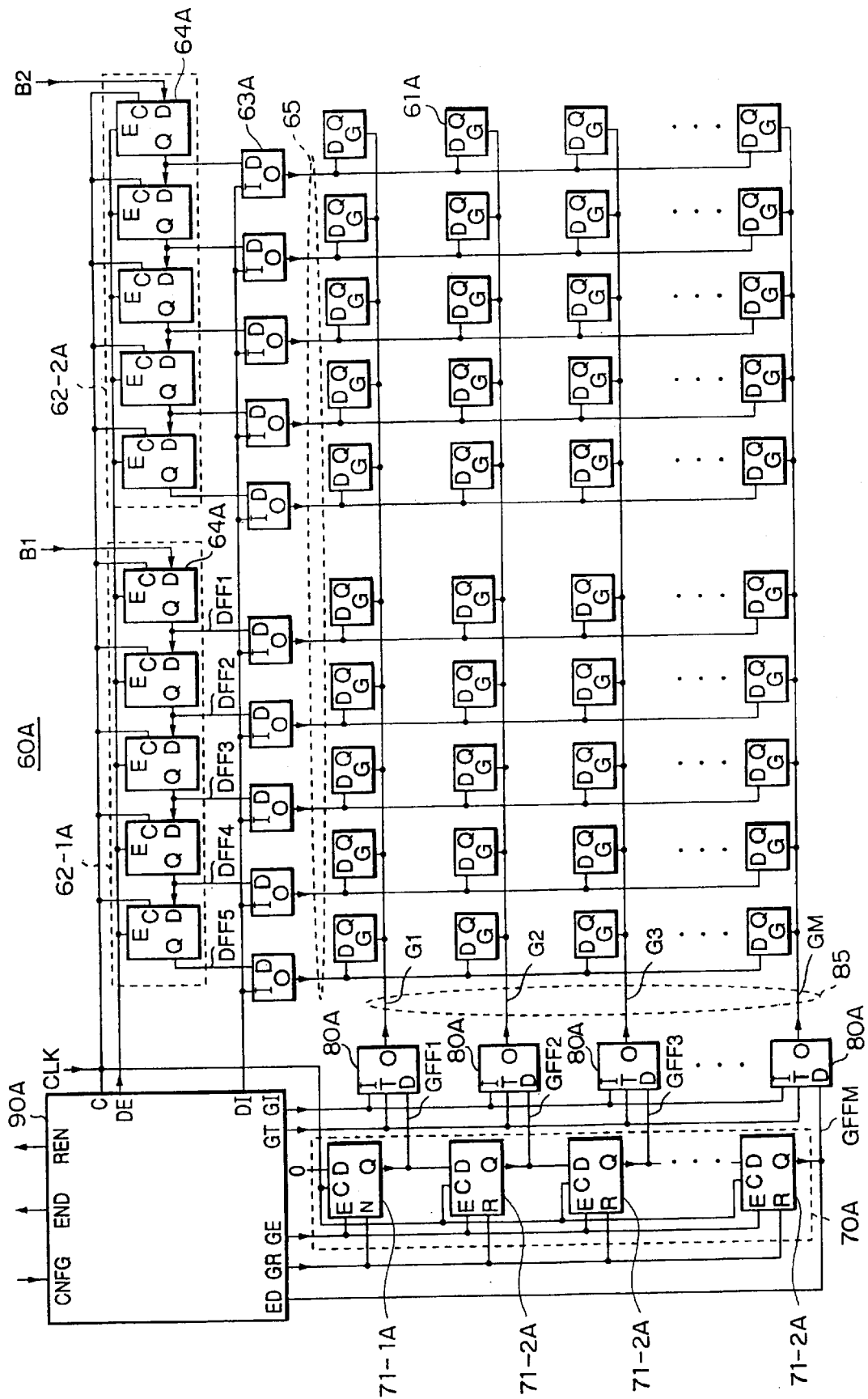
FIG. 3 is a circuit diagram showing the construction of a configuration circuit according to a first embodiment of the present invention.

In the circuitry shown in FIG. 3, the gate shift register 70A may also be called a row selecting circuit, and the plurality of gate control circuits 80A can be regarded as a single gate control circuit. The combination of these gate control circuit and row selecting circuit may also be called an addressing circuit.

The configuration control circuit 90A has a terminal REN through which a signal for controlling reading of configuration data is delivered. When the terminal REN is at the high level, an external circuit continues to output configuration data in sequence, whereas when the terminal REN is at the low level, the external circuit stops outputting new configuration data. In addition, the configuration control circuit 90A has a clock signal input terminal C and an input terminal CNFG through which to control the initialization of the configuration memories 61A and the start of configuration are controlled.

Figure 4:
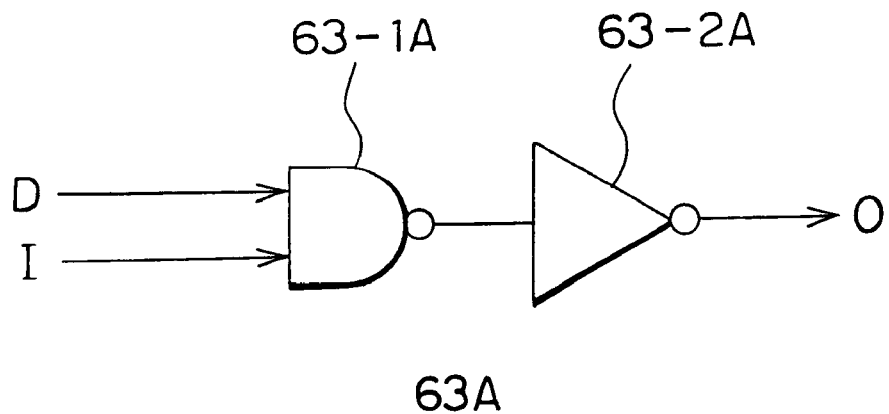
FIG. 4 is a diagram showing one example of a data initializing circuit shown in FIG. 3.

One example of the above-described type of data initializing circuits 63A will be described below with reference to FIG. 4. In this example, an output of a NAND circuit 63-1A for outputting a NAND signal obtained from an input to the terminal D and an input to the terminal I is connected to an input of an inverter 63-2A having a large driving power, and an output of the inverter 63-2A leads to the output O of the data initializing circuit 63A. When the input to the terminal I is asserted (when the input goes to the low level), the output O goes to the low level irrespective of the input to the terminal D. The low-level output at this time becomes an initial value for the configuration memories 61A. When the input to the terminal I is at the high level, the input to the terminal D which is configuration data is provided at the output O without modification.

Figure 5:
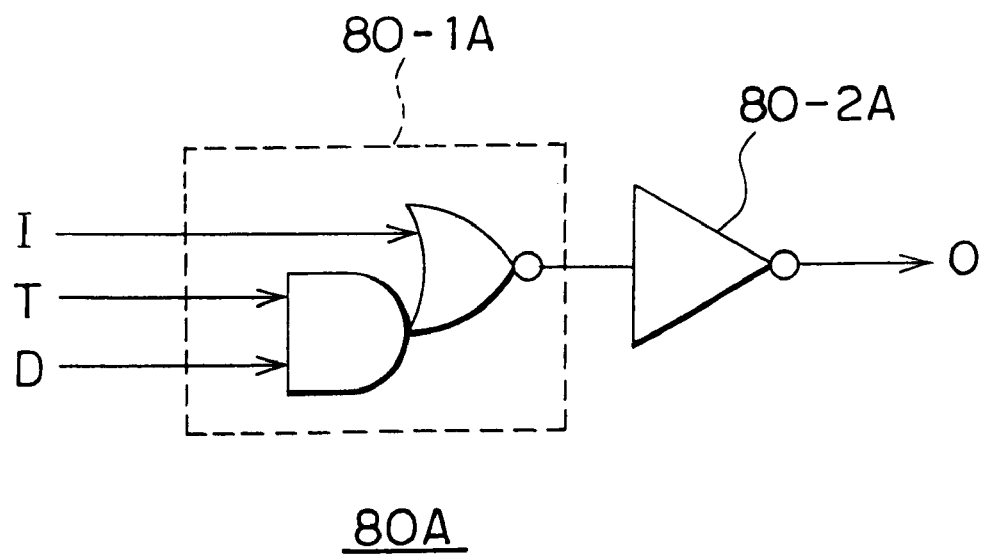
FIG. 5 is a diagram showing one example of a gate control circuit shown in FIG. 3.

One example of the above-described type of gate control circuits 80A will be described below with reference to FIG. 5. As shown in FIG. 5, the gate control circuit 80A has a circuit 80-1A for outputting an NOR signal which is obtained from an input to the terminal I and an AND signal obtained from an input to the terminal T and an input to the terminal D. An output of the circuit 80-1A is connected to an input of an inverter 80-2A having a large driving power, and an output of the inverter 80-2A leads to the output O of the gate control circuit 80A. When the input to the terminal I is asserted (when the input is at the high level), the output O goes to the high level irrespective of the other inputs. In this case, since the output O is connected to the gate input terminals G of the configuration memories 61A, initial data is written to the configuration memories 61A. If the input to the terminal I is at the low level, only when both the input to the terminal T and the input to the terminal D go to the high levels, the output O goes to the high level and the configuration memories 61A are brought to their writing states.

Figure 6:
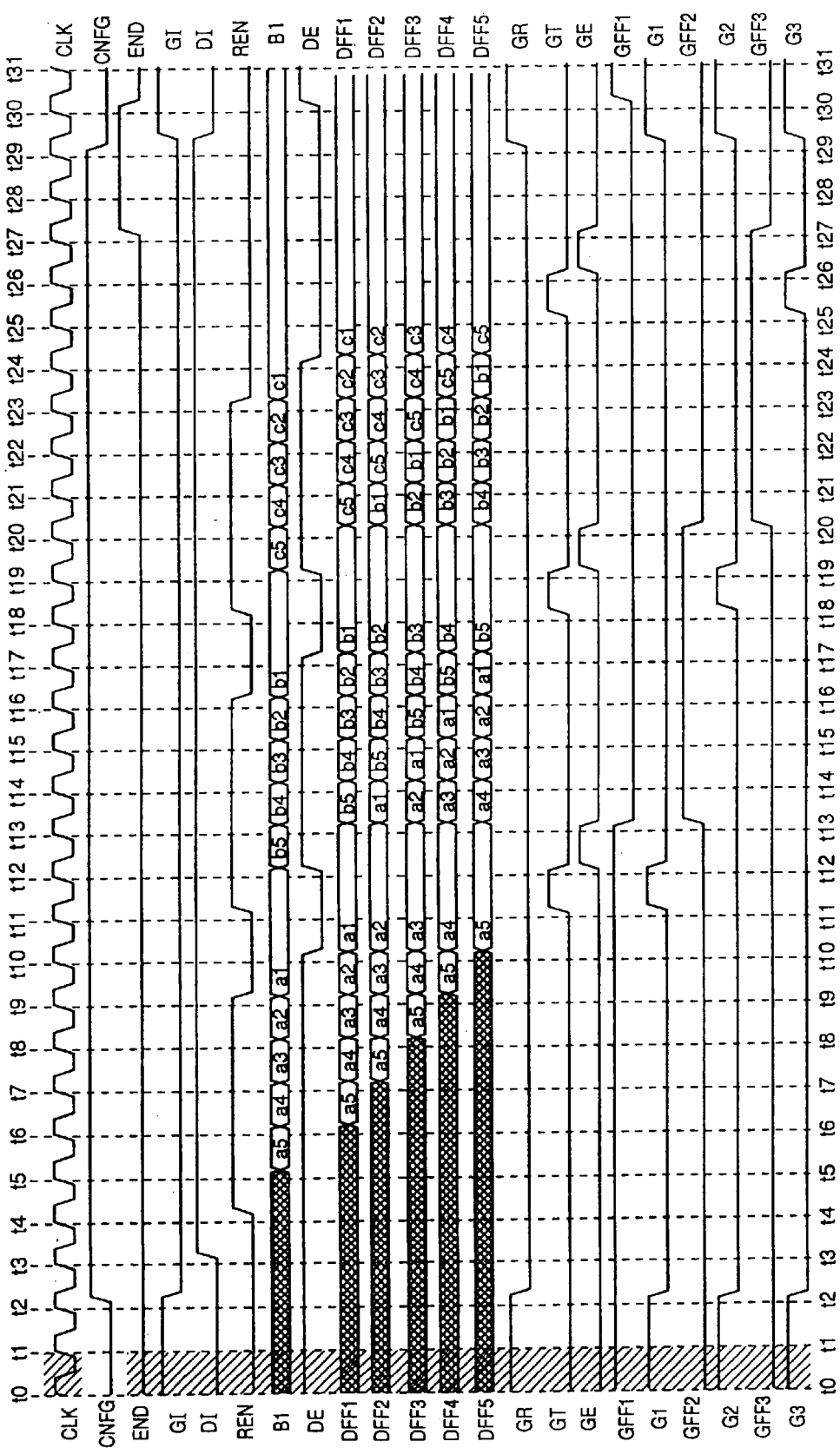
FIG. 6 is a timing chart aiding in describing the operation of the configuration circuit shown in FIG. 3.

The operation of the configuration circuit 60A according to the first embodiment will be described below with reference to FIG. 6. In FIG. 6, first of all, a power source (not shown) is turned on with the terminal CNFG remaining at the low level (at time t0 in FIG. 6). During the period of time from the time t0 until time t1 (a shaded portion of FIG. 6), a source voltage and clock signals are supplied to the entire circuitry, and signal levels fully rise and all the logic circuits become able to function. When the terminal CNFG is at the low level, the configuration control circuit 90A is initialized so that the data initializing terminal DI goes to the low level, the data clock enable terminal DE goes to the high level, the gate initializing terminal GI goes to the high level, the gating terminal GT goes to the low level, the gate clock enable terminal GE goes to the low level, the gate register initializing terminal GR goes to the high level, and the terminal REN and the terminal END go to the low levels. At this time, the outputs of all the data initializing circuits 63A, i.e., all the data lines 65, go to the low levels, while the outputs of all the gate control circuits 80A, i.e., all the gate lines 85, go to the high levels. Thus, initial values indicative of the low levels are respectively written into all the configuration memories 61A. In addition, the gate shift register 70A is initialized so that the first data output terminal GFF1 is initialized to the high level and the other data output terminal GFF2, GFF3, . . . , GFFM to the low levels. Incidentally, for the sake of simplicity, FIG. 6 shows a case in which the configuration memories 61A are arranged in three rows (M=3), i.e., the gate shift register 70A has three output terminals GFF1 to GFF3.

After the configuration circuit 60A has been initialized in the above-described manner and brought to a stable state, the terminal CNFG is set to the high level (time t2 in FIG. 6). Thus, the gate initializing terminal GI goes to the low level so that the outputs of all the gate control circuits 80A and all the gate lines 85 go to the low levels, and all the configuration memories 61A latch the initial values indicative of the low levels. In addition, the gate register initializing terminal GR goes to the low level, and the initializing signal for the gate shift register 70A becomes inactive. However, since the gate clock enable terminal GE remains at the low level, i.e., inactive, this initial state is held irrespective of the clock signal CLK.

It is to be noted that at time t3 which is a single clock after the time t2 that all the gate lines 85 become inactive, the data initializing terminal DI becomes inactive (high level) so that an enough data hold time can be taken to reliably latch the initial values in the respective configuration memories 61A.

At time t4 which is a single clock after the time t3, the terminal REN becomes the high level, and at each clock timing after the time t4, the configuration data B1 and B2 are supplied from the outside and read into the respective data shift registers 62-1A and 62-2A. In FIG. 6, symbols a5 to a1, b5 to b1 and c5 to c1 denote such configuration data, and only the configuration data B1 is shown for the sake of simplicity.

After the configuration data for the number of bits, s, of each of the data shift registers (5=5 in each of the examples shown in FIGS. 3 and 6) have been read in, the terminal REN is controlled to stop the supply of the configuration data during two clocks (the terminal REN is held at the low level from time t9 until time t11 in FIG. 6).

Similarly, the data clock enable terminal DE is kept inactive (low level) from the time t10 until time t12, whereby after having been filled with the configuration data, each of the data shift registers is held in that state during two clocks. During a single clock after each of the data shift registers has been filled with the configuration data (from the time t11 until time t12), the gating terminal GT is kept at the high level. During this time, since only the first output terminal GFF1 of the output terminals of the gate shift register 70A is at the high level, only the output of the gate control circuit 80A connected to the first output terminal GFF1 goes to the high level and, therefore, only a gate line G1 goes to the high level. Accordingly, the configuration data stored in each of the data shift registers are written into the configuration memories 61A for a single row which are connected to the gate line 85 (G1). The data in each of the data shift registers are kept unchanged for a single clock after the gate line 85(G1) has gone to the low level, so that an enough data hold time can be ensured to reliably latch the configuration data into the configuration memories 61A.

As described previously, the reason why, during two clocks after each of the data shift registers has been filled with the configuration data, the reading of the configuration data from the outside is stopped and the clock inputs of the data shift registers are supplied with a disable signal is to write the configuration data into the configuration memories 61A and ensure the data hold time.

During a single clock after the completion of the writing of the configuration data into the configuration memories 61A for a single row (from the time t12 until time t13), the gate crock enable terminal GE is held at the high level and the clock inputs of the gate shift registers are enabled. Thus, the high-level signal stored in the first D-type flip-flop of each of the gate shift registers is transferred to the second D-type flip-flop, and only the second output terminal GFF2 goes to the high level, while the other output terminals go to the low levels. At the same time, the reading of new configuration data into each of the data shift registers is started.

Subsequently, the writing of the configuration data into the configuration memories 61A arranged on the second row is performed through an operation similar to the above-described one. When such an operation is repeated and the writing of the configuration data into the configuration memories 61A arranged on all the rows is completed (time t27), the terminal END goes to the high level to inform the outside the end of configuration. Then, when the terminal CNFG is reset to the low level (time t29), the initialization of the configuration circuit 60A is again started to perform writing of new configuration data into the configuration memories 61A.

The configuration circuit 60A according to the first embodiment performs initialization of the configuration memories 61A by simultaneously writing initial value data to all the configuration memories 61A by utilizing the circuit for writing configuration data into the configuration memories 61A. Accordingly, it is not necessary that each of the configuration memory cells have an initializing circuit or terminal. In addition, since there is no need for global wiring network for initialization, an increase in installation area due to the provision of an initializing circuit can be made extremely small. Moreover, it is not necessary to use memory cells of the type which is automatically initialized at power on but is difficult to manufacture, and it is possible to initialize even normal memory cells at power on.

Figure 7:
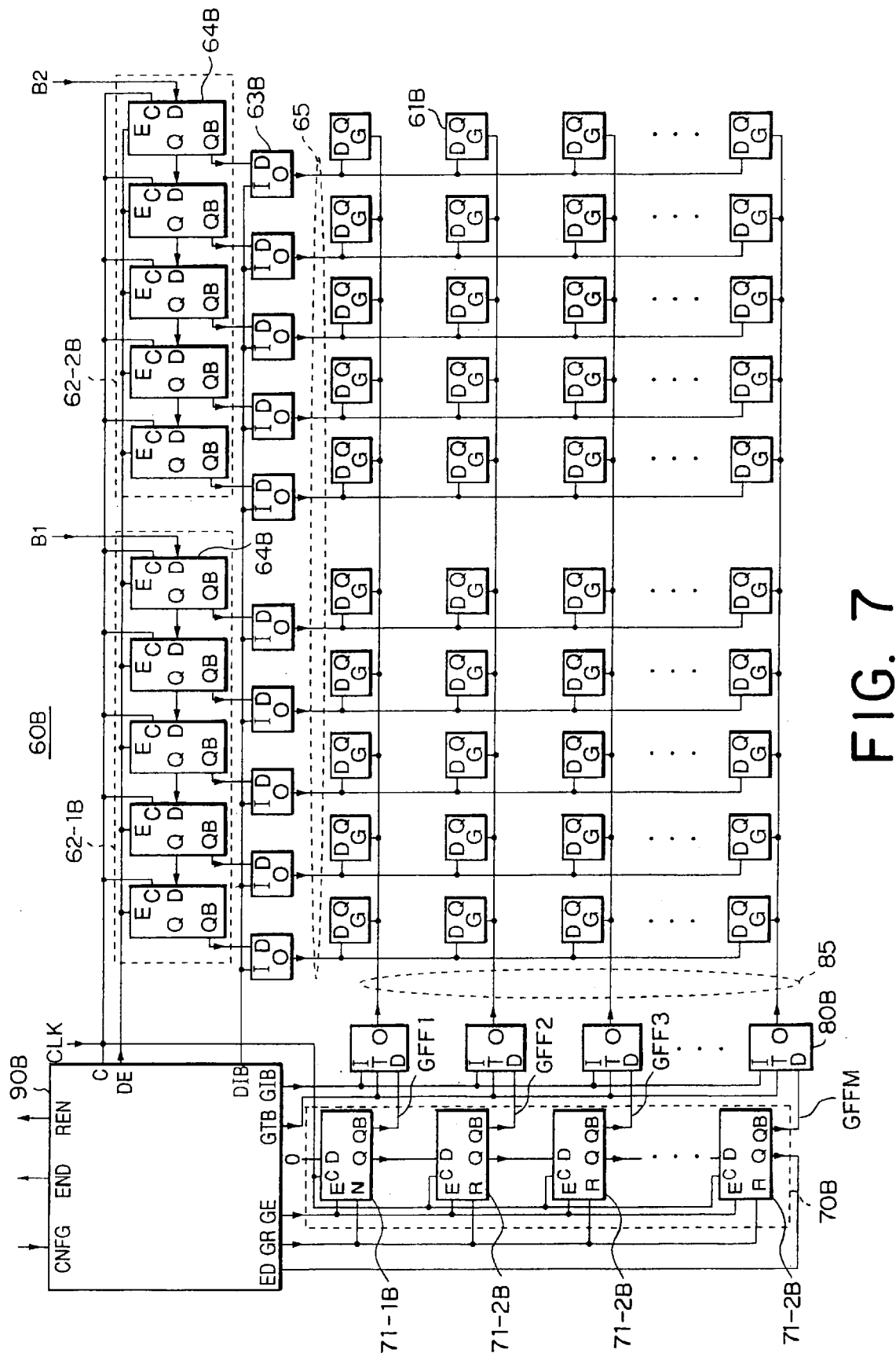
FIG. 7 is a circuit diagram showing the construction of a configuration circuit according to a second embodiment of the present invention.

A configuration circuit according to a second embodiment of the present invention will be described below with reference to FIG. 7. As shown in FIG. 7, a configuration circuit 60B includes a plurality of configuration memories 61B which are arranged in a two-dimensional array, data shift registers 62-1B and 62-2B, a plurality of data initializing circuits 63B, a gate shift register 70B, a plurality of gate control circuits 80B, and a configuration control circuit 90B.

The second embodiment differs from the first embodiment in the following two respects. The first difference is that inverted data output terminals QB of D-type flip-flops 64B provided in the data shift registers 62-1B and 62-2B are respectively connected to terminals D of the data initializing circuits 63B. The second difference is that inverted data output terminals QB of a D-type flip-flop 71-1B and a plurality of D-type flip-flops 71-2B provided in the gate shift register 70B are respectively connected to terminals D of the gate control circuits 80B. The other differences will become apparent from the following description.

The data shift register 62-1B is made of s D-type flip-flops 64B. In the data shift register 62-1B, a data input terminal D of a first D-type flip-flop 64B constitutes the data input terminal of the data shift register 62-1B and a data output terminal Q of an i-th D-type flip-flop 64B (i=1, 2, ..., S–1) is connected to a data input terminal D of an (i+1)-th D-type flip-flop 64B. Accordingly, the inverted data output terminals QB of all the D-type flip-flops 64B constitute data output terminals DFF1 to DFFs of the data shift register 62-1B. The data shift register 62-2B also has a similar construction. Incidentally, FIG. 7 shows an example of s=5.

Each of the D-type flip-flops 64B further has a clock input terminal C to be supplied with a clock signal CLK, and a clock enable terminal E which is connected to a data clock enable terminal DE of the configuration control circuit 90B. The data output terminals of each of the data shift registers 62-1B and 62-2B are connected to input terminals D of the corresponding data initializing circuits 63B. Input terminals I of all the data initializing circuits 63B are connected to a data initializing terminal DIB of the configuration control circuit 90B. An output terminal O of each of the data initializing circuits 63B is connected to the data input terminals D of the corresponding ones of the configuration memories 61B through the corresponding one of the plurality of data lines 65.

The gate shift register 70B includes a single D-type flip-flop 71-1B and (M–1) D-type flip-flops 71-2B. A data input terminal D of the D-type flip-flop 71-1B is fixed to the low level, and a data output terminal Q of the D-type flip-flop 71-1B is connected to a data input terminal of a first D-type flip-flop 71-2B. A data output terminal Q of an i-th D-type flip-flop 71-2B (i=1, 2, ..., M–1) is connected to a data input terminal of an (i+1)-th D-type flip-flop 71-2B. The inverted data output terminals QB of all the D-type flip-flops 71-1B and 71-2B are respectively connected to output terminals GFF1 to GFFM of the gate shift register 70B.

Each of the D-type flip-flops 71-1B and 71-2B further has a clock input terminal C to be supplied with the clock signal CLK, and a clock enable terminal E which is connected to the data clock enable terminal GE of the configuration control circuit 90B. The D-type flip-flop 71-1B further has an initializing terminal N which is connected to a gate register initializing terminal GR of the configuration control circuit 90B. Each of the D-type flip-flops 71-2B further has an initializing terminal R which is connected to the gate register initializing Iterminal GR of the configuration control circuit 90B.

If the gate register initializing terminal GR is asserted, the D-type flip-flop 71-1B of the gate shift register 70B is initialized to the high level, while the M D-type flip-flops 71-2B are initialized to the low levels. The respective data output terminals of the gate shift register 70B are connected to input terminals D of the corresponding gate control circuits 80B. Input terminals I of all the gate control circuits 80B are connected to a gate initializing terminal GIB of the configuration control circuit 90B. Input terminals T of all the gate control circuits 80B are connected to a gating terminal GTB of the configuration control circuit 90B.

An M-th output terminal GFFM of the gate shift register 70B is coupled to a terminal ED of the configuration control circuit 90B for sending an end-of-configuration signal. The configuration control circuit 90B has an output terminal END to inform the outside the end of configuration. Output terminals O of the respective gate control circuits 80B are connected to the gate input terminals G of the configuration memories 61B through the plurality of gate lines 85. The configuration control circuit 90B has a terminal REN to output a signal for controlling reading of configuration data.

When the terminal REN is at the high level, an external circuit continues to output configuration data in sequence, whereas when the terminal REN is at the low level, the external circuit stops outputting new configuration data. In addition, the configuration control circuit 90B has a clock signal input terminal C and an input terminal CNFG through which to control the initialization of the configuration memories 61B and the start of configuration are controlled.

Figure 8:
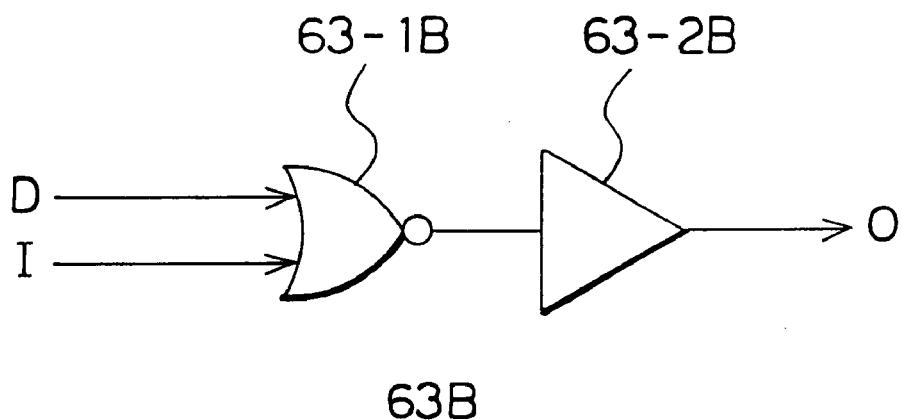
FIG. 8 is a diagram showing one example of a data initializing circuit shown in FIG. 7.

One example of the above-described type of data initializing circuits 63B will be described below with reference to FIG. 8. In the example shown in FIG. 8, the output of an NOR circuit 63-1B for outputting an NOR signal obtained from an input to the terminal D and an input to the terminal I is connected to an input of an buffer 63-2B having a large driving power, and an output of the buffer 63-2B leads to the output O of the data initializing circuit 63B. When the input to the terminal I is asserted (when the input goes to the high level), the output O goes to the low level irrespective of the input to the terminal D. The low-level output at this time becomes an initial value for the configuration memories 61B. When the input to the terminal I is at the low level, the input to the terminal D which is configuration data is provided at the output O without modification.

Figure 9:
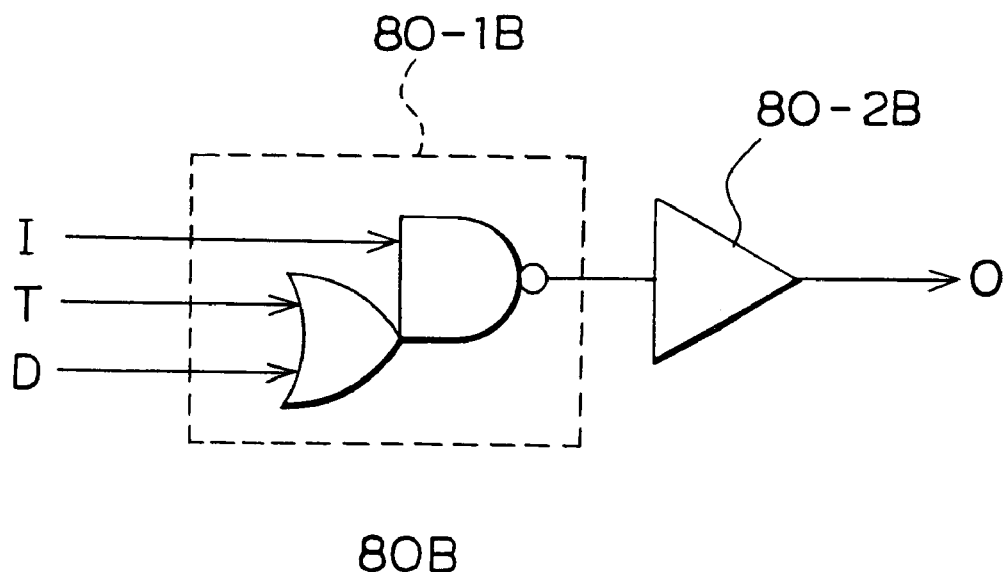
FIG. 9 is a diagram showing one example of a gate control circuit shown in FIG. 7.

One example of the above-described type of gate control circuits 80B will be described below with reference to FIG. 9. As shown in FIG. 9, the gate control circuit 80B has a circuit 80-1B for outputting an NAND signal which is obtained from an input to the terminal I and an OR signal obtained from an input to the terminal T and an input to the terminal D. An output of the circuit 80-1B is connected to an input of a buffer 80-2B having a large driving power, and an output of the buffer 80-2B leads to the output O of the gate control circuit BOB. When the input to the terminal I is asserted (when the input is at the low level), the output O goes to the high level irrespective of the other inputs. In this case, since the output O is connected to the gate input terminals G of the configuration memories 61B, initial data is written into the configuration memories 61B. If the input to the terminal I is at the high level, only when both the input to the terminal T and the input to the terminal D go to the low levels, the output O goes to the high level and the configuration memories 61B are brought to their writing states.

The operation of the configuration circuit 60B according to the second embodiment is similar to that of the configuration circuit according to the first embodiment except that the active levels of terminals DIB, GIB and GTB of the configuration control circuit 90B are respectively inverted with respect to the active levels of the terminals DI, GI and GT of the configuration control circuit 90A according to the first embodiment.

The configuration circuit 60B according to the second embodiment has the advantage of a far faster operation in addition to the advantage of the first embodiment. In the configuration circuit 60A according to the first embodiment, the data output terminal Q of each of the plurality of D-type flip-flops 64A which constitute the data shift register is connected to the data input terminal D of the next D-type flip-flop 64A and to the input terminal D of the corresponding one of the data initializing circuits 63A, while the data output terminal Q of each of the plurality of D-type flip-flops which constitute the gate shift register 70A is connected to the data input terminal D of the next D-type flip-flop and to the input terminal D of the gate control circuit 80A. This means that the load of the output terminal of the D-type flip-flop becomes large.

On the other hand, in the configuration circuit 60B according to the second embodiment, each of the plurality of D-type flip-flops which constitute the data shift register and the gate shift register 70B has the data output terminal Q and the inverted data output terminal QB. The data output terminal Q of each of the plurality of D-type flip-flops 64B which constitute the data shift registers is connected to only the data input terminal D of the next D-type flip-flop 64B, while the inverted data output terminal QB of each of the plurality of D-type flip-flops 64B is connected to only the input terminal D of the corresponding one of the data initializing circuits 63B. The data output terminal Q of each of the plurality of D-type flip-flops which constitute the gate shift register 70B is connected to only the data input terminal D of the next D-type flip-flop, while the inverted data output terminal QB of each of the plurality of D-type flip-flops is connected to only the input terminal D of the corresponding one of the gate control circuits 80B. Accordingly, the load of the output terminal of each of the D-type flip-flops becomes light so that the configuration circuit can operate at a far faster speed.

It is to be noted that any of the above-described configuration circuits is merely one example of a huge number of various feasible examples and the present invention is not limited to any of the above-described configuration circuits. For example, the initial value for the configuration memories can be set to the high level or the active level of the control signal can be changed (for example, from active high level to active low level) without changing the gist of the present invention. In addition, the data shifter registers and the gate shift register may be controlled not by clock enable signals but by controlling a clock signal inputted to each of the registers. Moreover, although in each of FIGS. 3 and 7, for the sake of simplicity, there is shown the case in which configuration data is inputted with a two-bit width of B1 and B2, the present invention can be applied to any case in which configuration data is inputted with any other bit width.

Figure 10:
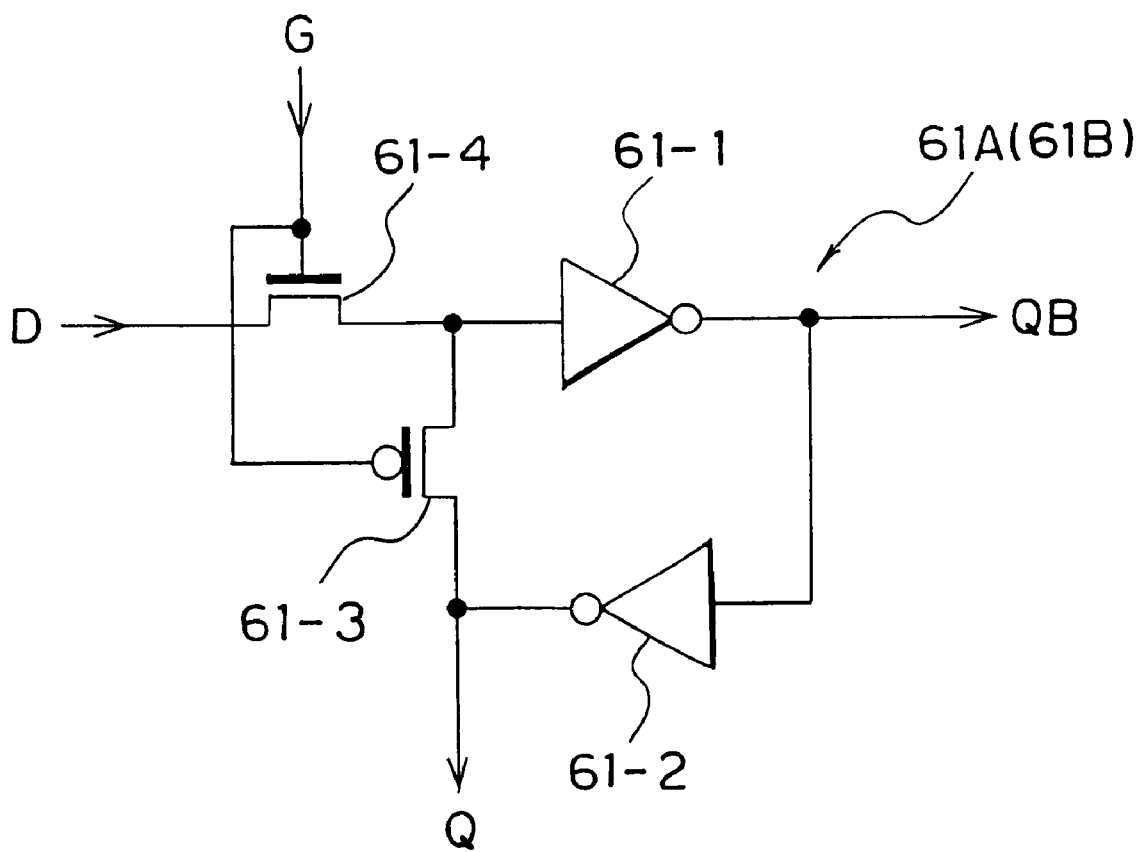
FIG. 10 is a circuit diagram showing a first example of a configuration memory for use in the present invention.

A first example of a configuration memory for use in the present invention will be described below with reference to FIG. 10. Although this first example can be applied to either of the first and the second embodiments described above, the following description will refer to the case in which the first example is applied to the configuration memories 61A in the first embodiment. In the example shown in FIG. 10, an output of a first inverter 61-1 is connected to an input of a second inverter 61-2 and also to an inverted output terminal QB of the configuration memory 61A. An output of the second inverter 61-2 is connected to either one of a source terminal and a drain terminal of a PMOS transistor 61-3 and also to the output terminal Q of the configuration memory 61A. The other of the source terminal and the drain terminal of the PMOS transistor 61-3 and one of a source terminal and a drain terminal of an NMOS transistor 61-4 are both connected to an input terminal of the first inverter 61-1. The other of the source terminal and the drain terminal of the NMOS transistor 61-4 is connected to the data input terminal D of the configuration memory 61A. Gate terminals of the NMOS transistor 61-4 and the PMOS transistor 61-3 are connected to the gate input terminal G of the configuration memory 61A.

Figure 11:
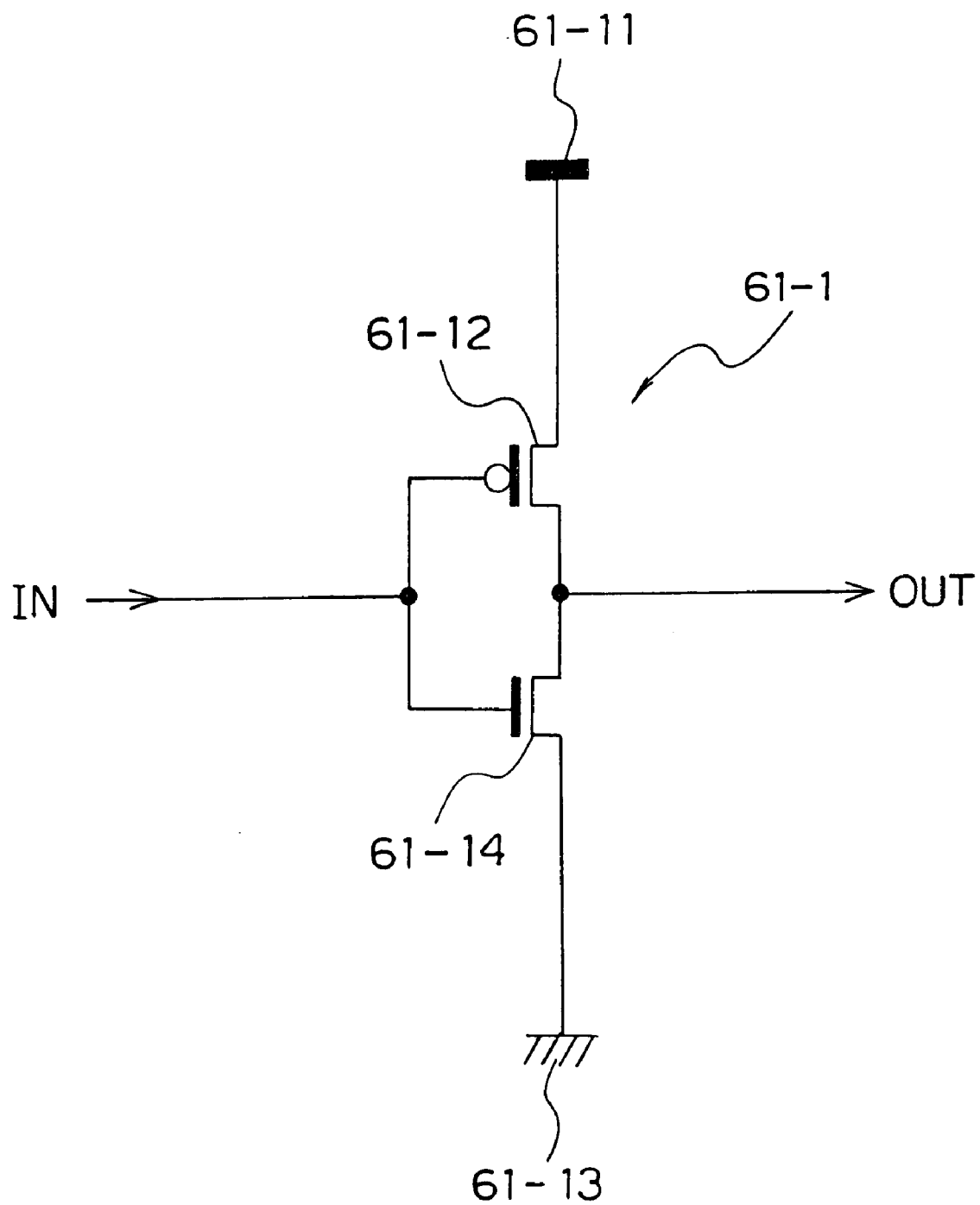
FIG. 11 is a circuit diagram of an inverter shown in FIG. 10.

As shown in FIG. 11, the first inverter 61-1 is made of a PMOS transistor 61-12 connected at the source terminal to a source line 61-11 and an NMOS transistor 61-14 connected at the source terminal to a ground line 61-13. The gate terminals of both the transistors 61-12 and 61-14 are connected to each other to constitute an input terminal IN of the first inverter 61-1, while the drain terminals of both the transistors 61-12 and 61-14 are connected to each other to constitute an output terminal OUT of the first inverter 61-1. The second inverter 61-2 has a structure identical to that of the first inverter 61-1.

Referring back to FIG. 10, when the gate input terminal G is at the high level (writing mode), the NMOS transistor 61-4 is placed in a conductive state and the PMOS transistor 61-3 is placed in a cut-off state, whereby a signal at the data input terminal D is written into the configuration memory 61A. When the gate input terminal G is at the low level, the NMOS transistor 61-4 is placed in a cut-off state and the PMOS transistor 61-3 is placed in a conductive state, whereby a data signal is latched in the configuration memory 61A.

A typical example of the layout of transistors in a configuration memory according to the present invention will be described below with reference to FIG. 12. In the most widely used type of CMOS process, an N-region (for example, an N-well) 61-5 and a P-region (for example, a P-substrate) 61-6 are defined between a source line 61-11 and a ground line 61-13 and, in general, a pair of PMOS transistors 61-3 and 61-12 and a pair of NMOS transistors 61-4 and 61-14 are formed in the respective regions 61-5 and 61-6. In the case of the circuit of FIG. 10, the arrangement shown in FIG. 12 is desirable in terms of area efficiency.

Figure 12:
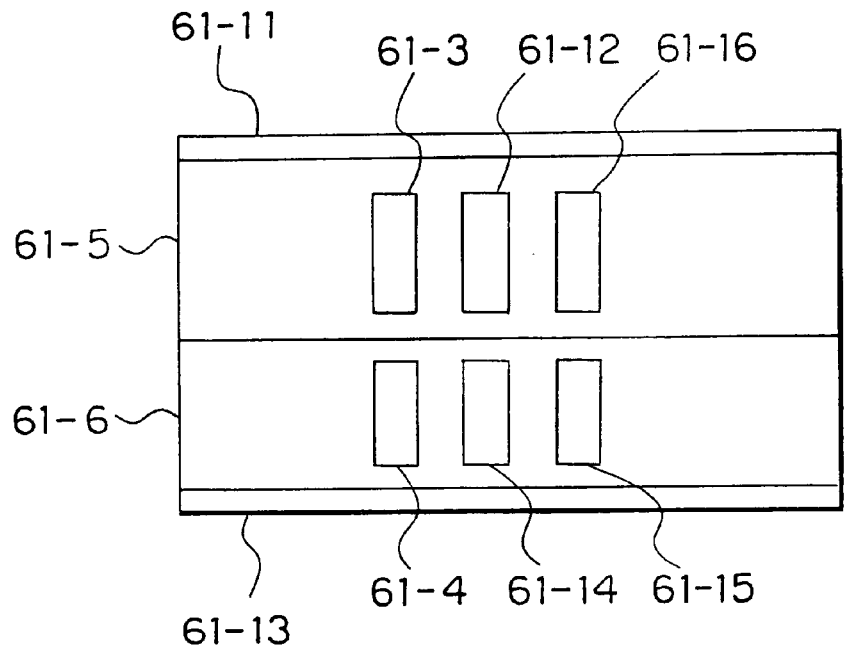
FIG. 12 is a schematic view of the layout of transistors in a configuration memory for use in the present invention.

As shown in FIG. 12, the NMOS transistor 61-14 and the PMOS transistor 61-12 which constitute the first inverter 61-1 are respectively arranged in the P-region 61-6 and the N-region 61-5 in a paired form. Similarly, the NMOS transistor 61-15 and the PMS transistor 61-16 which constitute the second inverter 61-2 are respectively arranged in the P-region 61-6 and the N-region 61-5 in a paired manner, and the NMOS transistor 61-4 and the PMOS transistor 61-3 are also arranged in a paired manner.

It is to be noted that the number of transistors in the conventional type of configuration memory is smaller by one than that in the configuration memory according to the present invention. This is because the conventional type of configuration memory does not have a transistor corresponding to the PMOS transistor 61-3 shown in FIG. 10 or 12. However, in the conventional type of configuration memory, even if such transistor is absent, the P-region has no space to be paired with a vacant portion in which the transistor is absent, and the space cannot easily find other uses and is highly likely to remain as a clearance. Accordingly, although the present invention is greater than the conventional example by one in the number of transistors per configuration memory, the effective occupied area in the present invention is nearly the same as that in the conventional example.

Unlike the conventional type of configuration memory, the configuration memory according to the present invention is constructed so that, during its writing mode, a data input signal and the output signal of the second inverter 61-2 are disconnected from each other. Accordingly, both signals do not collide with each other and a fully high input logic level can be applied to the input of the first inverter 61-1, whereby data writing can be performed reliably and rapidly. Moreover, since a through-current due to the collision between both signals can be prevented, power consumption can also be reduced. In a case in which the above-described configuration circuit according to the present invention is used, when all the configuration memories are to be initialized, initializing data are simultaneously written to a multiplicity of configuration memories connected to a single data line. For this reason, in the conventional type of memory cells in particular, a total through-current becomes extremely large and, in the worst case, their circuits may be broken. Otherwise, there is a possibility that the signal levels of data lines degrade to a great extent and the initialization of memory cells becomes impossible. In contrast, if the configuration memory according to the present invention is used, a through-current does not occur and such problems can be avoided.

Figure 13:
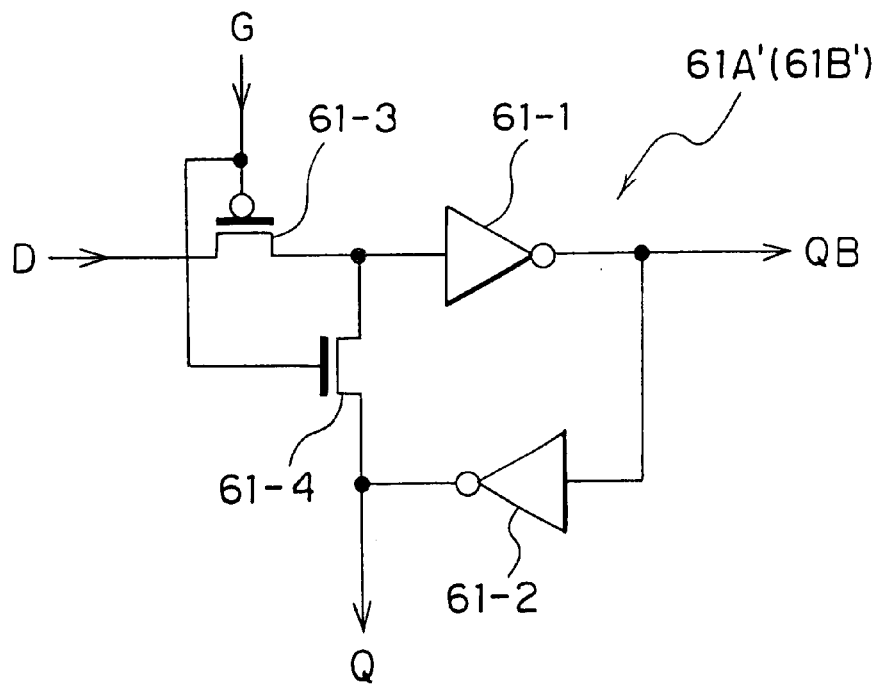
FIG. 13 is a circuit diagram showing a second example of a configuration memory for use in the present invention.

A second example of the configuration memory for use in the present invention will be described below with reference to FIG. 13. This configuration memory can also be applied to either of the first and second embodiments. Unlike the configuration memory 61A of the first example (FIG. 10), in a configuration memory 61A', the NMOS transistor 61-4 and the PMOS transistor 61-3 are replaced with each other. In the second example, when the gate input terminal G is at the low level, the configuration memory 61A' is placed in the writing mode, whereas when the gate input terminal G is at the high level, data is latched in the configuration memory 61A'.

According to the present invention, it is possible to achieve the following effects. The first effect is that configuration memories can readily be initialized. This is because since circuits for writing data to the configuration memories are utilized to write initial value data to the configuration memories and initialize the same, the configuration memories are automatically initialized at power on. In addition, it is not necessary to use memories difficult to manufacture nor large memories provided with initializing circuits.

The second effect is that data can be rapidly and reliably written into the configuration memories, no large power consumption does occur during data writing. This is because, in each of the configuration memories, transistors are inserted between an input terminal for a data signal to be written and an output signal terminal so that both terminals can be disconnected from each other during data writing.

What is claimed is:

1. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:

at least one data shift register including a plurality of flip-flops and having a data input terminal, a plurality of data output terminals, and a clock input terminal, said at least one data shift register being operative to serially read data through said data input terminal in synchronism with a clock signal inputted to said clock input terminal, and shifting data held internally in said at least one data shift register by sequentially propagating the data through the plurality of flip-flops included in the at least one data shift register;

a plurality of data initializing circuits each having at least a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive, wherein said initial value is provided only by said data initializing circuits.

2. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:

at least one data shift register having a data input terminal, a plurality of data output terminals, and a clock input terminal, said at least one data shift register being operative to serially read data through said data input terminal in synchronism with a clock signal inputted to said clock input terminal, and shifting data held internally in said at least one data shift register;

a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive;

wherein said addressing circuit includes:

a row selecting circuit having a plurality of address output terminals corresponding to respective rows of said memory cell array, and being operative to make active the address output terminal corresponding to a row to be selected; and a gate control circuit having a plurality of first input terminals, a plurality of second input terminals, a plurality of third input terminals, and a plurality of output terminals, said plurality of first input terminals being connected to said plurality of address output terminals of said row selecting circuit, a gating signal being applied to said plurality of second input terminals, a gate initializing signal being applied to said plurality of third input terminals, said plurality of output terminals being connected to said memory cells arranged along the respective row of said memory cell array, said gate control circuit being operative to make said plurality of output terminals active when said gate initializing signal is active, and, when said gate initializing signal is inactive, make said plurality of output terminals active only when both said first input terminals of said gate control circuit and said gating signal become active.

3. A programmable function device according to claim 2, wherein said row selecting circuit includes a shift register having a plurality of address output terminals and a clock input terminal, only a single bit of said shift register being made active so that the active bit is shifted to an adjacent bit in synchronism with a clock input signal provided at said clock input terminal and, when said active bit scans all bits of said shift register once, configuration data is written into all of said memory cells.

4. A programmable function device according to claim 2, wherein said row selecting circuit includes a shift register having a plurality of address output terminals, a clock input terminal, and a clock enable terminal, only a single bit of said shift register being made active so that, when an input signal at said clock enable terminal is at its active level, the active bit is shifted to an adjacent bit in synchronism with a clock input signal provided at said clock input terminal and, when said active bit scans all bits of said shift register once, configuration data is written into all of said memory cells.

5. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:

at least one data shift register having a data input terminal, a plurality of data output terminals, a clock input terminal, and a clock enable terminal, said at least one data shift register being operative to, when an input to said clock enable terminal is at its active level, serially read data through said data input terminal in synchronism with a clock signal inputted to said clock input terminal and to shift data held internally in said at least one data shift register;

a plurality of data initializing circuits each having at least a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive.

6. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:

at least one data shift register having a data input terminal, a plurality of data output terminals, a clock input terminal, and a clock enable terminal, said at least one data shift register being operative to, when an input to said clock enable terminal is at its active level, serially read data through said data input terminal in synchronism with a clock signal inputted to said clock input terminal and to shift data held internally in said at least one data shift register;

a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive;

wherein said addressing circuit includes:

a row selecting circuit having a plurality of address output terminals corresponding to respective rows of said memory cell array, being operative to make active an address output terminal corresponding to a row to be selected; and a gate control circuit having a plurality of first input terminals, a plurality of second input terminals, a plurality of third input terminals, and a plurality of output terminals, said plurality of first input terminals being connected to said plurality of address output terminals of said row selecting circuit, a gating signal being applied to said plurality of second input terminals, a gate initializing signal being applied to said plurality of third input terminals, said plurality of output terminals being connected to said memory cells arranged along the respective row of said memory cell array, said gate control circuit being operative to make said plurality of output terminals active when said gate initializing signal is active, and, when said gate initializing signal is inactive, make said plurality of output terminals active only when both said first input terminals of said gate control circuit and said gating signal become active.

7. A programmable function device according to claim 6, wherein said row selecting circuit includes a shift register having a plurality of address output terminals and a clock input terminal, only a single bit of said shift register being made active so that the active bit is shifted to an adjacent bit in synchronism with a clock input signal provided at said clock input terminal and, when said active bit scans all bits of said shift register once, configuration data is written into all of said memory cells.

8. A programmable function device according to claim 6, wherein said row selecting circuit includes a shift register having a plurality of address output terminals, a clock input terminal, and a clock enable terminal, only a single bit of said shift register being made active so that, when an input signal at said clock enable terminal is at its active level, the active bit is shifted to an adjacent bit in synchronism with a clock input signal provided at said clock input terminal and, when said active bit scans all bits of said shift register once, configuration data is written into all of said memory cells.

9. A programmable function device in which one logic function is selected from among a plurality of logic functions according to data stored in a memory cell array made of a plurality of memory cells arranged in the form of an array, wherein at least one memory cell of said plurality of memory cells which constitutes said memory cell array is a memory cell comprising a first inverter, a second inverter, a PMOS transistor, an NMOS transistor, a writing data input terminal, and a gate input terminal;

an output of said first inverter being connected to an input of said second inverter, an output of said second inverter being connected to either one of a source terminal and a drain terminal of said PMOS transistor, the other of the source terminal and the drain terminal of said PMOS transistor and either one of a source terminal and a drain terminal of said NMOS transistor being connected to an input of said first inverter, the other of the source terminal and the drain terminal of said NMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell, wherein said writing data input terminal is coupled to an output terminal of a data initializing circuit that generates an initial value determined by only a data initializing signal when said data initializing signal is made active.

10. A programmable function device in which one logic function is selected from among a plurality of logic functions according to data stored in a memory cell array made of a plurality of memory cells arranged in the form of an array, wherein at least one memory cell of said plurality of memory cells which constitutes said memory cell array is a memory cell comprising a first inverter, a second inverter, a PMOS transistor, an NMOS transistor, a writing data input terminal, and a gate input terminal;

an output of said first inverter being connected to an input of said second inverter, an output of said second inverter being connected to either one of a source terminal and a drain terminal of said NMOS transistor, the other of the source terminal and the drain terminal of said NMOS transistor and either one of a source terminal and a drain terminal of said PMOS transistor being connected to an input of said first inverter, the other of the source terminal and the drain terminal of said PMOS transistor being connected to said writing data input terminal, and a gate terminal of said NMOS transistor and a gate terminal of said PMOS transistor being connected to said gate input terminal, at least one of the output of said first inventor and the output of said second inverter being outputted as an output of said memory cell, wherein said writing data input terminal is coupled to an output terminal of a data initializing circuit that generates an initial value determined by only a data initializing signal when said data initializing signal is made active.

11. A programmable function device in which one logic function is selected from among a plurality of logic functions depending on a value of data stored in a memory cell array made of a plurality of memory cells arranged in the form of an array, comprising a configuration circuit for writing data into said memory cell array, said configuration circuit including:

at least one data shift register including a plurality of flip-flops and having a data input terminal, a plurality of data output terminals, and a clock input terminal, said at least one data shift register being operative to serially read data through said data input terminal in synchronism with a clock signal inputted to said clock input terminal, and shifting data held internally in said at least one data shift register by sequentially propagating the data through the plurality of flip-flops included in the at least one data shift register;

a plurality of data initializing circuits each having at least a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive, wherein said initial value is provided only by said data initializing circuits, said memory cell comprising a first inverter, a second inverter, a PMOS transistor, an NMOS transistor, a writing data input terminal, and a gate input terminal;

an output of said first inverter being connected to an input of said second inverter, an output of said second inverter being connected to either one of a source terminal and a drain terminal of said PMOS transistor, the other of the source terminal and the drain terminal of said PMOS transistor and either one of a source terminal and a drain terminal of said NMOS transistor being connected to an input of said first inverter, the other of the source terminal and the drain terminal of said NMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell.

12. A programmable function device in which one logic function is selected from among a plurality of logic functions depending on data stored in a memory cell array made of a plurality of memory cells arranged in the form of an array, comprising a configuration circuit for writing data into said memory cell array, said configuration circuit including:

at least one data shift register having a data input terminal, a plurality of data output terminals, and a clock input terminal, said at least one data shift register being operative to serially read data through said data input terminal in synchronism with a clock signal inputted to said clock input terminal, and shifting data held internally in said at least one data shift register;

a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive, said memory cell comprising a first inverter, a second inverter, a PMOS transistor, an NMOS transistor, a writing data input terminal, and a gate input terminal;

an output of said first inverter being connected to an input of said second inverter, an output of said second inverter being connected to either one of a source terminal and a drain terminal of said PMOS transistor, the other of the source terminal and the drain terminal of said PMOS transistor and either one of a source terminal and a drain terminal of said NMOS transistor being connected to an input of said first inverter, the other of the source terminal and the drain terminal of said NMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell;

wherein said addressing circuit includes:
a row selecting circuit having a plurality of address output terminals corresponding to respective rows of said memory cell array, and being operative to make active the address output terminal corresponding to a row to be selected; and a gate control circuit having a plurality of first input terminals, a plurality of second input terminals, a plurality of third input terminals, and a plurality of output terminals, said plurality of first input terminals being connected to said plurality of address output terminals of said row selecting circuit, a gating signal being applied to said plurality of second input terminals, a gate initializing signal being applied to said plurality of third input terminals, said plurality of output terminals being connected to said memory cells arranged along the respective row of said memory cell array, said gate control circuit being operative to make said plurality of output terminals active when said gate initializing signal is active, and, when said gate initializing signal is inactive, make said plurality of output terminals active only when both said first input terminals of said gate control circuit and said grating-signal become active.

13. A programmable function device according to claim 12, wherein said row selecting circuit includes a shift register having a plurality of address output terminals and a clock input terminal, only a single bit of said shift register being made active so that the active bit is shifted to an adjacent bit in synchronism with a clock input signal provided at said clock input terminal and, when said active bit scans all bits of said shift register once, configuration data is written into all of said memory cells.

14. A programmable function device according to claim 12, wherein said row selecting circuit includes a shift register having a plurality of address output terminals, a clock input terminal, and a clock enable terminal, only a single bit of said shift register being made active so that, when an input signal at said clock enable terminal is at its active level, the active bit is shifted to an adjacent bit in synchronism with a clock input signal provided at said clock input terminal and, when said active bit scans all bits of said shift register once, configuration data is written into all of said memory cells.

15. A programmable function device in which one logic function is selected from among a plurality of logic functions depending on data stored in a memory cell array made of a plurality of memory cells arranged in the form of an array, comprising a configuration circuit for writing data into said memory cell array, said configuration circuit including:

at least one data shift register including a plurality of flip-flops and having a data input terminal, a plurality of data output terminals, and a clock input terminal, said at least one data shift register being operative to serially read data through said data input terminal in synchronism with a clock signal inputted to said clock input terminal, and shifting data held internally in said at least one data shift register by sequentially propagating the data through the plurality of flip-flops included in the at least one data shift register;

a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive, wherein said initial value is provided only by said data initializing circuits, said memory cell comprising a first inverter, a second inverter, a PMOS transistor, an NMOS transistor, a writing data input terminal, and a gate input terminal;

an output of said first inverter being connected to an input of said second inverter, an output of said second inverter being connected to either one of a source terminal and a drain terminal of said NMOS transistor, the other of the source terminal and the drain terminal of said NMOS transistor and either one of a source terminal and a drain terminal of said NMOS transistor and either one of a source terminal and a drain terminal of said PMOS transistor being connected to an input of said first inverter, the other of the source terminal and the drain terminal of said PMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell.

16. A programmable function device in which one logic function is selected from among a plurality of logic functions depending on data stored in a memory cell array made of a plurality of memory cells arranged in the form of an array, comprising a configuration circuit for writing data into said memory cell array, said configuration circuit including:

at least one data shift register having a data input terminal, a plurality of data output terminals, and a clock input terminal, said at least one data shift register being operative to serially read data through said data input terminal in synchronism with a clock signal inputted to said clock input terminal, and shifting data held internally in said at least one data shift register;

a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive, said memory cell comprising a first inverter, a second inverter, a PMOS transistor, an NMOS transistor, a writing data input terminal, and a gate input terminal;

an output of said first inverter being connected to an input of said second inverter, an output of said second inverter being connected to either one of a source terminal and a drain terminal of said NMOS transistor, the other of the source terminal and the drain terminal of said NMOS transistor and either one of a source terminal and a drain terminal of said NMOS transistor and either one of a source terminal and a drain terminal of said PMOS transistor being connected to an input of said first inverter, the other of the source terminal and the drain terminal of said PMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell;

wherein said addressing circuit includes:

a row selecting circuit having a plurality of address output terminals corresponding to respective rows of said memory cell array, and being operative to make active the address output terminal corresponding to a row to be selected; and a gate control circuit having a plurality of first input terminals, a plurality of second input terminals, a plurality of third input terminals, and a plurality of output terminals, said plurality of first input terminals being connected to said plurality of address output terminals of said row selecting circuit, a gating signal being applied to said plurality of second input terminals, a gate initializing signal being applied to said plurality of third input terminals, said plurality of output terminals being connected to said memory cells arranged along the respective row of said memory cell array, said gate control circuit being operative to make said plurality of output terminals active when said gate initializing signal is active, and, when said gate initializing signal is inactive, make said plurality of output terminals active only when both said first input terminals of said gate control circuit and said gating signal become active.

17. A programmable function device according to claim 16, wherein said row selecting circuit includes a shift register having a plurality of address output terminals and a clock input terminal, only a single bit of said shift register being made active so that the active bit is shifted to an adjacent bit in synchronism with a clock input signal provided at said clock input terminal and, when said active bit scans all bits of said shift register once, configuration data is written into all of said memory cells.

18. A programmable function device according to claim 16, wherein said row selecting circuit includes a shift register having a plurality of address output terminals, a clock input terminal, and a clock enable terminal, only a single bit of said shift register being made active so that, when an input signal at said clock enable terminal is at its active level, the active bit is shifted to an adjacent bit in synchronism with a clock input signal provided at said clock input terminal and, when said active bit scans all bits of said shift register once, configuration data is written into all of said memory cells.

19. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:

at least one data shift register having a data input terminal, a plurality of data output terminals, a clock input terminal, and a clock enable terminal, said at least one data shift register being operative to, when an input to said clock enable terminal is at its active level, serially read data through said data input terminal in synchronism with a clock signal inputted to said clock input terminal and to shift data held internally in said at least one data shift register;

a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row;

each of said data initializing circuits being operative to output an initial value to be written into said memory cell array when said data initializing signal is made active, and to output a signal corresponding to a signal applied to said first initializing input terminal when said data initializing signal is made inactive, said memory cell comprising a first inverter, a second inverter, a PMOS transistor, an NMOS transistor, a writing data input terminal, and a gate input terminal; an output of said first inverter being connected to an input of said second inverter, an output of said second inverter being connected to either one of a source terminal and a drain terminal of said PMOS transistor, the other of the source terminal and the drain terminal of said PMOS transistor, the other of the source terminal and the drain terminal of said PMOS transistor and either one of a source terminal and a drain terminal of said NMOS transistor being connected to an input of said first inverter, the other of the source terminal and the drain terminal of said NMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell.

20. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:

at least one data shift register having a data input terminal, a plurality of data output terminals, a clock input terminal, and a clock enable terminal, said at least one data shift register being operative to, when an input to said clock enable terminal is at its active level, serially read data through said data input terminal in synchronism with a clock signal inputted to said clock input terminal and to shift data held internally in said at least one data shift register; a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and an addressing circuit for selecting at least one row of said memory cell array and writing an output signal of a corresponding one of said data initializing circuits into memory cells arranged along the selected at least one row;

each of said data initializing circuits being operative to output an initial value to be written into said memory cell array when said data initializing signal is made active, and to output a signal corresponding to a signal applied to said first initializing input terminal when said data initializing signal is made inactive, said memory cell comprising a first inverter, a second inverter, a PMOS transistor, an NMOS transistor, a writing data input terminal, and a gate input terminal; an output of said first inverter being connected to an input of said second inverter, an output of said second inverter being connected to either one of a source terminal and a drain terminal of said PMOS transistor, the other of the source terminal and the drain terminal of said PMOS transistor, the other of the source terminal and the drain terminal of said PMOS transistor and either one of a source terminal and a drain terminal of said NMOS transistor being connected to an input of said first inverter, the other of the source terminal and the drain terminal of said NMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell;

wherein said addressing circuit includes:
  a row selecting circuit having a plurality of address output terminals corresponding to respective rows of said memory cell array, being operative to make active an address output terminal corresponding to a row to be selected; and
  a gate control circuit having a plurality of first input terminals, a plurality of second input terminals, a plurality of third input terminals, and a plurality of output terminals, said plurality of first input terminals being connected to said plurality of address output terminals of said row selecting circuit, a gating signal being applied to said plurality of second input terminals, a gate initializing signal being applied to said plurality of third input terminals, said plurality of output terminals being connected to said memory cells arranged along the respective row of said memory cell array,
  said gate control circuit being operative to make said plurality of output terminals active when said gate initializing signal is active, and, when said gate initializing signal is inactive, make said plurality of output terminals active only when both said first input terminals of said gate control circuit and said gating signal become active.

21. A programmable function device according to claim 20, wherein said row selecting circuit includes a shift register having a plurality of address output terminals and a clock input terminal, only a single bit of said shift register being made active so that the active bit is shifted to an adjacent bit in synchronism with a clock input signal provided at said clock input terminal and, when said active bit scans all bits of said shift register once, configuration data is written into all of said memory cells.

22. A programmable function device according to claim 20, wherein said row selecting circuit includes a shift register having a plurality of address output terminals, a clock input terminal, and a clock enable terminal, only a single bit of said shift register being made active so that, when an input signal at said clock enable terminal is at its active level, the active bit is shifted to an adjacent bit in synchronism with a clock input signal provided at said clock input terminal and, when said active bit scans all bits of said shift register once, configuration data is written into all of said memory cells.

23. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:
at least one data shift register having a data input terminal, a plurality of data output terminals, a clock input terminal, and a clock enable terminal, said at least one data shift register being operative to, when an input to said clock enable terminal is at its active level, serially read data through said data input terminal in synchronism with a clock signal inputted to said clock input terminal and to shift data held internally in said at least one data shift register;
a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and
an addressing circuit for selecting at least one row of said memory cell array and writing an output signal of a corresponding one of said data initializing circuits into memory cells arranged along the selected at least one row,
each of said data initializing circuits being operative to output an initial value to be written into said memory cell array when said data initializing signal is made active, and to output a signal corresponding to a signal applied to said first initializing input terminal when said data initializing signal is made inactive,
said memory cell comprising a first inverter, a second inverter, a PMOS transistor, an NMOS transistor, a writing data input terminal, and a gate input terminal; an output of said first inverter being connected to an input of said second inverter, an output of said second inverter being connected to either one of a source terminal and a drain terminal of said NMOS transistor, the other of the source terminal and the drain terminal of said NMOS transistor and either one of a source terminal and a drain terminal of said PMOS transistor being connected to an input of said first inverter, the other of the source terminal and the drain terminal of said PMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell.

24. A programmable function device in which one logic function is selected from among a plurality of logic functions according to data stored in a memory cell array made of a plurality of memory cells arranged in the form of an array, comprising a configuration circuit for writing data into said memory cell array, said configuration circuit including:
at least one data shift register having a data input terminal, a plurality of data output terminals, a clock input terminal, and a clock enable terminal, said at least one data shift register being operative to, when an input to said clock enable terminal is at its active level, serially read data through said data input terminal in synchronism with a clock signal inputted to said clock input terminal and to shift data held internally in said at least one data shift register;
a plurality of data initializing circuits each having a first initializing input terminal, a second initializing input terminal, and an initializing output terminal, each of said first initializing input terminals being connected to each of said plurality of data output terminals, a data initializing signal being applied to a plurality of said second initializing input terminals, said initializing output terminal being connected to data input terminals of memory cells arranged along one of a plurality of columns of said memory cell array; and
an addressing circuit for selecting at least one row of said memory cell array and writing an output signal of a corresponding one of said data initializing circuits into memory cells arranged along the selected at least one row, each of said data initializing circuits being operative to output an initial value to be written into said memory cell array when said data initializing signal is made active, and to output a signal corresponding to a signal applied to said first initializing input terminal when said data initializing signal is made inactive,
said memory cell comprising a first inverter, a second inverter, a PMOS transistor, an NMOS transistor, a writing data input terminal, and a gate input terminal; an output of said first inverter being connected to an input of said second inverter, an output of said second inverter being connected to either one of a source terminal and a drain terminal of said NMOS transistor, the other of the source terminal and the drain terminal of said NMOS transistor and either one of a source terminal and a drain terminal of said PMOS transistor being connected to an input of said first inverter, the other of the source terminal and the drain terminal of said PMOS transistor being connected to said writing data input terminal, and a gate terminal of said NMOS transistor and a gate terminal of said PMOS transistor being connected to said gate input terminal, at least one of the output of said first inverter and the output of said second inverter being outputted as an output of said memory cell
wherein said addressing circuit includes:
a row selecting circuit having a plurality of address output terminals corresponding to respective rows of said memory cell array, being operative to make active an address output terminal corresponding to a row to be selected; and a gate control circuit having a plurality of first input terminals, a plurality of second input terminals, a plurality of third input terminals, and a plurality of output terminals, said plurality of first input terminals being connected to said plurality of address output terminals of said row selecting circuit, a gating signal being applied to said plurality of second input terminals, a gate initializing signal being applied to said plurality of third input terminals, said plurality of output terminals being connected to said memory cells arranged along the respective row of said memory cell array, said gate control circuit being operative to make said plurality of output terminals active when said gate initializing signal is active, and, when said gate initializing signal is inactive, make said plurality of output terminals active only when both said first input terminals of said gate control circuit and said gating signal become active.

25. A programmable function device according to claim 24, wherein said row selecting circuit includes a shift register having a plurality of address output terminals and a clock input terminal, only a single bit of said shift register being made active so that the active bit is shifted to an adjacent bit in synchronism with a clock input signal provided at said clock input terminal and, when said active bit scans all bits of said shift register once, configuration data is written into all of said memory cells.

26. A programmable function device according to claim 24, wherein said row selecting circuit includes a shift register having a plurality of address output terminals, a clock input terminal, and a clock enable terminal, only a single bit of said shift register being made active so that, when an input signal at said clock enable terminal is at its active level, the active bit is shifted to an adjacent bit in synchronism with a clock input signal provided at said clock input terminal and, when said active bit scans all bits of said shift register once, configuration data is written into all of said memory cells.

* * * * *